US012782475B2

(12) United States Patent
Mailhe et al.

(10) Patent No.: US 12,782,475 B2
(45) Date of Patent: Nov. 3, 2026

(54) RAPID SPECIFIC ABSORPTION RATE ESTIMATION IN MAGNETIC RESONANCE MEDICAL IMAGING

(71) Applicant: Siemens Healthineers AG, Forchheim (DE)

(72) Inventors: Boris Mailhe, Plainsboro, NJ (US); Daniel Niederlöhner, Erlangen (DE); Daniel Rinck, Forchheim (DE); David Grodzki, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 202 days.

(21) Appl. No.: 18/967,722

(22) Filed: Dec. 4, 2024

(65) Prior Publication Data

US 2026/0153576 A1 Jun. 4, 2026

(51) Int. Cl.
*G01R 33/28* (2006.01)
*G01R 29/08* (2006.01)
*G06T 7/00* (2017.01)

(52) U.S. Cl.
CPC ....... *G01R 33/288* (2013.01); *G01R 29/0857* (2013.01); *G06T 7/0012* (2013.01); *G06T 2207/20081* (2013.01); *G06T 2207/20084* (2013.01); *G06T 2207/30088* (2013.01)

(58) Field of Classification Search
CPC ............. G01R 33/288; G01R 29/0857; G06T 7/0012; G06T 2207/20081; G06T 2207/20084; G06T 2207/30088; G06T 2207/10088
See application file for complete search history.

(56) References Cited

U.S. PATENT DOCUMENTS

| | | | | |
|---|---|---|---|---|
| 11,257,259 | B2 | 2/2022 | Teixeira | |
| 11,478,212 | B2 | 10/2022 | Singh et al. | |
| 12,033,247 | B2 | 7/2024 | Balashova | |
| 2008/0231270 | A1* | 9/2008 | Fontius ................ | G01R 33/583 324/307 |
| 2024/0103105 | A1 | 3/2024 | Possanzini | |
| 2025/0235117 | A1* | 7/2025 | Chang .................... | A61B 5/055 |

OTHER PUBLICATIONS

Gokyar Sayim et al: "MRSaiFE: An Al-Based Approach Towards the Real-Time Prediction of Specific Absorption Rate", IEEE Access, vol. 9, Oct. 21, 2021 (Oct. 21, 2021), pp. 140824-140834, XP093415356, USA ISSN: 2169-3536, DOI: 10.1109/access.2021.3118290.

(Continued)

*Primary Examiner* — G.M. A Hyder

(57) ABSTRACT

For estimating SAR in MR scanning, a value for a SAR metric is determined from patient measurements, such as a depth camera image of the outer surface of a patient. A machine-learned model is used in the determination, such as for segmenting different tissue types with different electric field characteristics and/or estimating a SAR characteristic from tissue maps. Rather than time consuming calculations to model the patient and/or estimate SAR from patient information, the machine-learned model is used to estimate patient-specific SAR from the measurements of the patient more rapidly and accurately.

20 Claims, 5 Drawing Sheets

(56) References Cited

OTHER PUBLICATIONS

Meliado E.F. et al: "A deep learning method for image-based subject-specific local SAR assessment", Magnetic Resonance in Medicine, vol. 83, No. 2, Sep. 4, 2019 (Sep. 4, 2019), pp. 695-711, XP093415367, US ISSN: 0740-3194, DOI: 10.1002/mrm.27948.
MRI Specific Absorption, p. 1-5. Obtained Dec 2, 2024. Rate(SAR)https://mrimaster.com/#google_vignette.
Penny, Christopher. "Computation of Fields and SAR for MRI With Finite-Difference, Time-Domain Software." Microwave Journal 50.12 (2007). pp. 1-5.
U.S. Appl. No. 18/420,080, filed Jan. 23, 2024.
Penney, Christopher. "Computation of Fields and SAR for MRI With Finite-Difference, Time-Domain Software." Microwave Journal 50.12 (2007). pp. 1-5.

* cited by examiner

| **Spatial error metrics ($V.m^{-1}$)** | | **Train (620)** | **Test (62)** |
|---|---|---|---|
| Mean | | 0.06 | 0.10 |
| Quantiles | 25% | 0.01 | 0.02 |
| | 50% | 0.03 | 0.05 |
| | 75% | 0.07 | 0.12 |
| | 95% | 0.22 | 0.35 |
| | 99% | 0.49 | 0.69 |
| Max | | 5.16 | 5.06 |

RAPID SPECIFIC ABSORPTION RATE ESTIMATION IN MAGNETIC RESONANCE MEDICAL IMAGING

BACKGROUND

In magnetic resonance (MR) imaging (MRI), a measurable signal is generated by exciting spins in a strong main magnetic B0 with a radio frequency (RF) transverse field B1. This RF excitation also generates an RF electric field, which can deposit energy in the body by resistive heating. To mitigate risk of RF-induced burns and/or heating the patient to dangerous temperatures, the amount of deposited power per unit of tissue mass (i.e., Specific Absorption Rate (SAR)) is monitored. Depending on the application and regulatory environment, several variants of SAR metrics are defined (e.g., local/global, averaged over different time windows, separate monitoring for head, . . . ).

Total RF power dissipation over time can be measured on the scanner by taking the difference between the emitted and received fields in the signal transmit chain. Patient SAR also depends on the spatial distribution of that dissipated power and patient mass distribution. The spatial SAR distribution is approximated by closed-form derivations of a simplified union-of-cylinders geometrical patient model with various ad hoc corrections to improve the fit to observed measurements. Although the physics of electric field propagation are well understood, two roadblocks prevent accurate physical modeling from being used for SAR monitoring: the lack of accurate patient-specific tissue models to be used as inputs for field computations and the high computational cost of real-time field simulations.

SUMMARY

By way of introduction, the preferred embodiments described below include methods, systems, instructions, and non-transitory computer readable media for estimating SAR in MR scanning. A value for a SAR metric is determined from patient measurements, such as a depth camera image of the outer surface of a patient. A machine-learned model is used in the determination, such as for segmenting different tissue types with different electric field characteristics and/or estimating a SAR characteristic from tissue maps. Rather than time consuming calculations to model the patient and/or estimate SAR from patient information, the machine-learned model is used to estimate patient-specific SAR from the measurements of the patient more rapidly and accurately.

In a first aspect, a method is provided for estimating SAR in MR scanning. A sensor captures surface data representing an outer surface of a patient. A segmentation of tissues internal to the patient is generated from the surface data by a first machine-learned model in response to input of the surface data. A SAR characteristic is estimated by a second machine-learned model in response to input of the segmentation of the tissues. A value for a SAR metric is determined from the SAR characteristic. The MR scanning of the patient is performed when the value of the SAR metric is within a safety threshold.

In a second aspect, a method is provided for estimating SAR in MR scanning. A sensor captures surface data representing an outer surface of a patient. A value for a SAR metric is determined from the surface data using a machine-learned model. The MR scanning of the patient is performed when the value of the SAR metric is within a safety threshold.

In a third aspect, a system is provided for estimating SAR in MR scanning. A MR scanner is configured to transmit radio frequency (RF) pulses into a patient. A camera is configured to capture an outer surface of the patient. An image processor is configured to determine a value for a SAR metric for the RF pulses from the outer surface using a machine-learned model. A display is configured to display the value for the SAR metric.

Further aspects or features of the aspects are provided as Illustrative Examples below. Any of the Illustrative Examples may be used with any of the different of the aspects above.

The present invention is defined by the following claims, and nothing in this section should be taken as a limitation on those claims. Further aspects and advantages of the invention are discussed below in conjunction with the preferred embodiments and may be later claimed independently or in combination.

DETAILED DESCRIPTION

The accuracy of SAR modeling is improved by using one or more machine-learned models. For example, patient-specific SAR models use pre-scan data (e.g., patient registration statistics (clinical data), camera data, MR pre-scans (e.g., localizers), and/or data from other sensors) and artificial intelligence (AI)-accelerated electric field simulation.

Increased accuracy of SAR estimation may reduce the safety margins required to keep burn probabilities below a given threshold, thus increasing the sequence design space (e.g., larger flip angles, higher SMS factors, . . . ). Patient-specific models may better represent anatomical variabilities that are currently ignored (e.g., extreme lean or fat body compositions for a given height and/or weight). Grounding the AI-based estimation in field simulations may take inhomogeneous B1 transmits into account, such as used for high tesla (e.g., 7T) main fields B0. The AI-based estimation, while accounting for inhomogeneous B1, may enable SAR monitoring in lower tesla systems with relaxed homogeneity requirements. Rapid and accurate estimation of local SAR may allow for real-time supervision, allowing regulatory monitoring of local SAR in a variety of situations. Any electric field simulation for the SAR estimation provides B1 maps specific to the patient, which may be used to improve MR acquisition and/or reconstruction (e.g., to correct for spatially variable flip angles and/or the B1 maps do not need to be measured in an adjustment step to speed up overall imaging).

Figure 1:
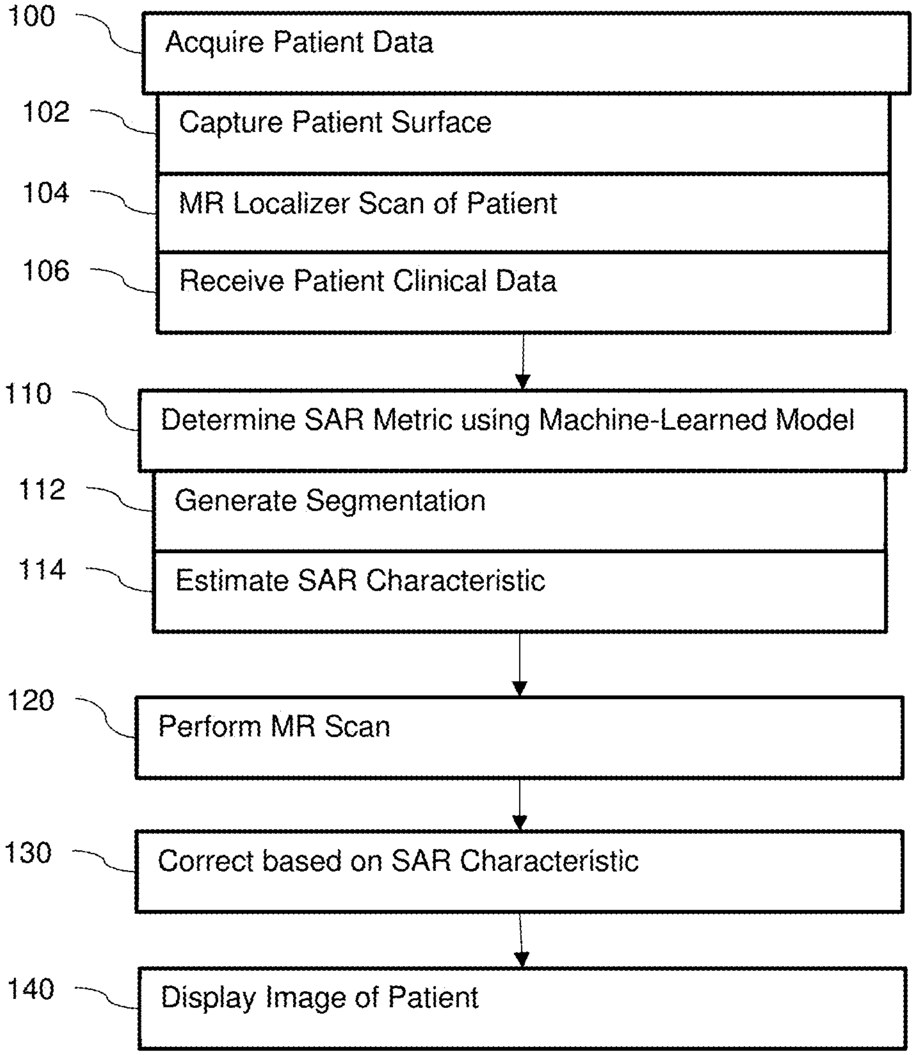
FIG. 1 is a flow chart diagram of one implementation of a method for estimating SAR in MRI.
Figures 2, 3:
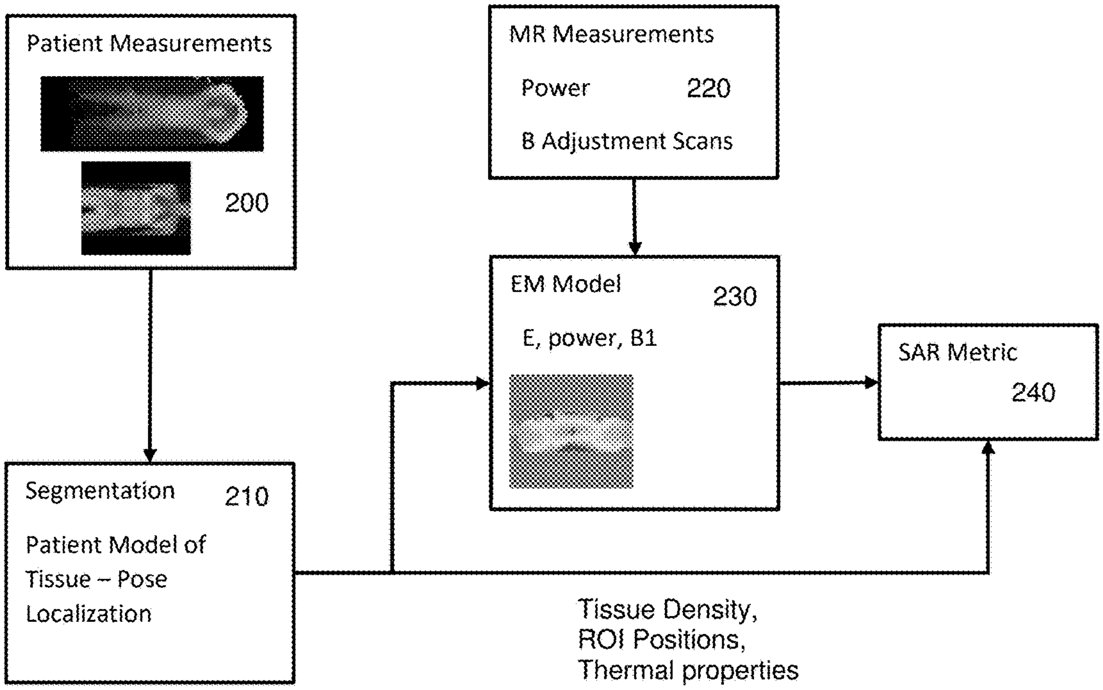
FIG. 2 illustrates SAR estimation from patient measurements, including measurement of an outer surface of the patient.
FIG. 3 is a table showing accuracy provided by machine-learning-based SAR estimation.

FIG. 1 is a flow chart diagram of an implementation of a method of estimating SAR in MR scanning. FIG. 2 illustrates one example data flow or workflow for the method of FIG. 1. A machine-learning model is used within the workflow taking patient-specific measurements, such as an image of an outer surface (e.g., skin) of the patient, and estimating electric field information and/or a value for a SAR metric.

Figure 4:
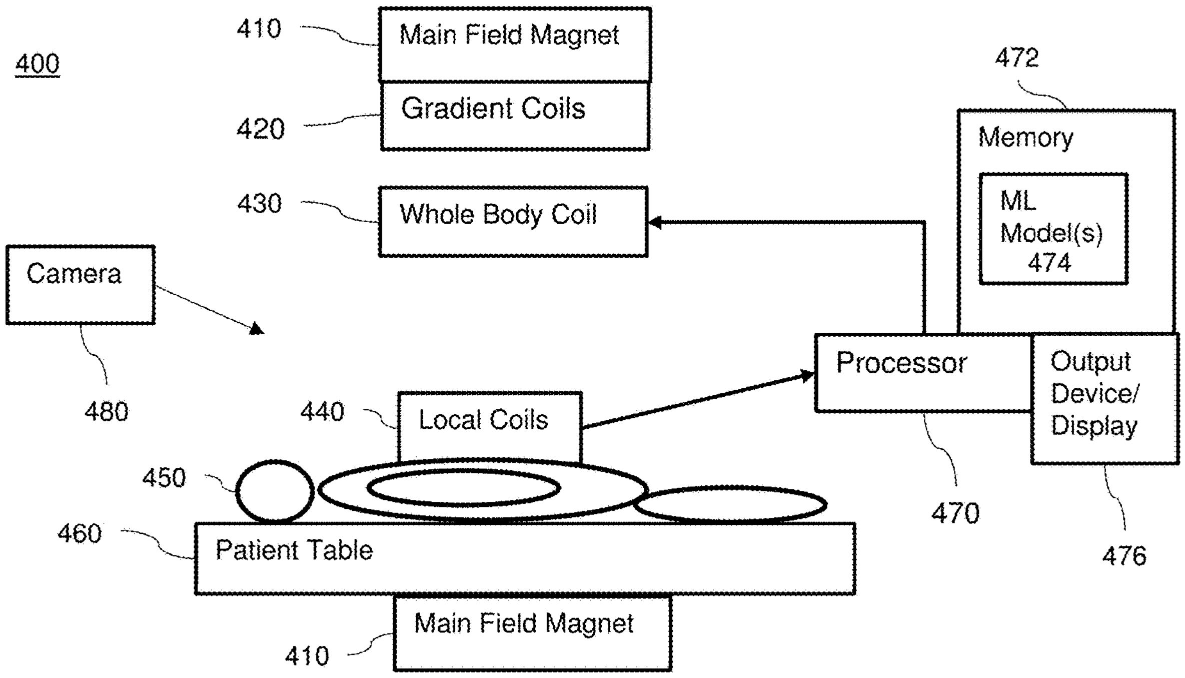
FIG. 4 is a block diagram of an implementation of an MR system for estimating SAR.

The method is performed by the system of FIG. 4 or another system. A processor acquires data from a patient health record in act 100. A camera may acquire in act 102; a MR scanner may acquire in act 104; and a user interface may acquire in act 106. A processor determines the SAR metric in act 110, such as through segmentation in act 112 and estimation in act 114. The MR scanner may perform act 120, and a processor may correct or use electric field information for scanning or reconstruction in act 130. A display displays in act 140. Other components may be used, such as a remote server or a workstation performing act 110.

Various acts may use a machine-learned model (i.e., AI). For example, one or more machine-learned models are used for act 110. As another example, one machine-learned model is used for act 112, and another machine-learned model is used for act 114. During application of the machine-learned model for one or more different patients, the same learned weights or values of the machine-learned model are used. The model and values for the learnable parameters are not changed from one patient to the next, at least over a given time (e.g., weeks, months, or years) or given number of uses (e.g., tens or hundreds). These fixed values and corresponding fixed model are applied sequentially and/or by different processors for different patients. The model may be updated, such as retrained, or replaced, but does not learn new values as part of application for a given patient. In other embodiments, continuous learning is used.

The method is performed in the order shown (top to bottom or numerical) or other orders. For example, act 130 may be performed as part of act 120. Acts 102, 104, and 106 may be performed in any order or simultaneously.

Additional, different, or fewer acts may be provided. For example, act 104 and/or act 106 are not provided. As another example, act 120 is not provided, such as where the value of the SAR metric indicates a safety risk to the patient. Act 130 may not be performed. In another example, acts for configuring the MR scanner for diagnostic scanning of the patient are included.

In act 100, a processor acquires patient data. Other devices may be used to acquire the data, and the processor accesses the acquired data by transfer over a computer network and/or accessing the data from a memory.

Any patient-specific data may be acquired. Acts 102, 104, and 106 show an example implementation acquiring a surface of the patient, MR scan of the patient, and clinical data for the patient. Additional, different, or fewer types of patient-specific data may be acquired. Any combination of one, two, or all three of acts 102, 104, and/or 106 and the associated data may be used, such as acquiring the patient surface in act 102 or the localizer scan in act 104 but not both. FIG. 2 shows acquiring both a patient surface and a localizer image as the patient measurements 200. Other types of input data may be used, such as generic or not-patient specific data (e.g., a statistical shape model).

In act 102, a sensor captures an outer surface of a patient. The sensor is a depth sensor, such as a 2.5D or RGBD camera (e.g., Microsoft Kinect 2 or ASUS Xtion Pro). The depth sensor may be a camera or cameras capturing a grid projected onto the patient. Multiple cameras may reconstruct an outer surface from multiple images without transmission of structured light. Lidar with or without an optical camera may be used. Other optical or non-ionizing sensors may be used.

The sensor is directed at a patient. The sensor captures the outer surface of the patient from one or more perspectives. Any portion of the outer surface may be captured, such as the entire patient from head to toe and hand to hand on one side or just the torso.

The outer surface is the skin of the patient. In other embodiments, the outer surface includes clothing. The sensor may or may not use a frequency that passes through clothing and detects the skin surface.

The outer surface is captured as depths from the sensor to different locations on the patient, an image or photograph of the outside of the patient, or both. The sensor outputs the sensed image and/or depths as surface data. Alternatively, the sensor measurements are processed to determine the outer surface information (i.e., surface data), such as stereoscopically determining the outer surface from camera images from different angles with image processing.

The measurements of the outer surface from the sensor are surface data for the patient. In one embodiment, the measurements or other output of the sensor are used to determine the surface data. The output is processed to determine the surface data. For example, a statistical shape model is fit to the depths. The statistical shape model is a mesh or other representation of an average or other statistical representation of an outside of a human or part of a human. The statistical shape model includes probabilities or other constraints on alteration, so that the fitting maintains the shape based on statistics. The surface data is then determined from the fit statistical shape model, such as depths from a point to the model.

The surface data may include different representations of the patient, such as the depths from the fit model and a projection of the outer surface (e.g., a camera image) or a thickness. The thickness may be a difference of a given depth from the maximum and minimum depth for the model or the depths from the sensor. For example, given a 3D surface mesh of a patient, 2D projections of the data are generated as a skin surface image and a depth image. As another example, the 3D human surface mesh data is represented with a 2-channel 2D image—the first channel stores the depth of the body surface as observed from front, and second channel stores the thickness computed by measuring the distance between the closest and furthest point as observed from front. Other surface data may be used.

In act 104, a patient representation of the patient in a MR scanner is acquired from an MR localizer scan or another scout scan. The patient representation is a 2D or 3D representation reconstructed from raw data (e.g., k-space data) acquired by a localizer or another scout scan. A stack of slices or images may be reconstructed. A volume may be reconstructed. A single slice or slab may be reconstructed.

The scout scan may have a more limited field of view and/or resolution than a following diagnostic MR scan. For example, the field of view of the scout scan does not include part or all of one or more arms, legs, and/or head of the patient. A MR localizer image is acquired from a short scan (e.g., shorter than the diagnostic scan) and is generally used in MR examination to generate scout or localizer images to localize the anatomical position of the internal organ to be examined. The localizer imaging is not impacted by patient clothes, coils, and quilts but has a limited field of view such that body parts closer to the bore wall are not visible in the localizer images.

The patient representation (e.g., MR localizer image or scan) may also be used for estimating SAR. The patient representation reconstructed or formed from the scout scan may be used in SAR estimation.

In act 106, a processor receives clinical data for the patient. The processor receives the clinical data by transfer over a computer network and/or access to memory. For example, the processor mines a patient health record for the clinical data. As another example, the processor receives the clinical health data by entry on a user interface and/or from an order for performing an MR diagnostic scan or MRI.

The clinical data is the height, weight, body mass index, strength, and/or another measurement of the patient. Other clinical data, such as from blood tests and/or medical history, may be received. The clinical data may include an initial diagnosis or other registration information (e.g., registration statistics) for the MRI scan.

In act 110, the processor (e.g., image processor) determines a value for a SAR metric. The value may be for a specific location in the patient. A map of values for the SAR metric for different locations in the patient may be determined. The value may be instead a value for a region or all the patient.

The value is determined from the information acquired in act 100. For example, the value is determined from the patient surface (surface data), reconstructed localizer image, and/or clinical data.

The determination in act 110 uses one or more machine-learned models. A single machine-learned model may output the value of the SAR metric 240 or SAR characteristics in response to input of the patient measurements 200. In other implementations, the single machine-learned model is used for part of the determination of the SAR metric 240, such as for segmentation 210 or estimation of the electromagnetic (EM) field or value of the SAR metric 240 from the segmentation 210. In another implementation, one machine-learned model is used for segmentation, and another machine-learned model is used for estimation of SAR information. The machine-learned model or models may be used for any of segmentation, tissue mapping of tissue characteristics used in Finite Difference Time Domain (FDTD) simulation, estimation of radio frequency absorption or dissipation, estimation of the electric field, estimation of any other SAR characteristic, and/or determination of a value of one or more SAR metrics from SAR characteristics.

Acts 112 and 114 of FIG. 1 and the workflow of FIG. 2 show using one machine-learned model for segmentation 210 and another machine-learned model for electric field or EM field simulation 230. Other combinations may be provided.

Any machine-learned model may be used, such as a neural network. In one implementation, a neural network arranged as an image-to-image model is used. Inputs representing values over an area or volume are input, and the image-to-image model outputs values representing a same or different area or volume. A fully-connected or convolutional neural network may be used. In another implementation, the image-to-image model is an encoder and decoder. A U-Net may be used.

In one implementation, one machine-learned model as an image-to-image model or network is used for segmentation, and another machine-learned model as an image-to-image model or network is used to estimate one or more SAR characteristics as a function of location, such as estimating electric field, power absorption, or patient specific B1 field. In another implementation, a machine-learned model for estimation of a value of a SAR metric uses an encoder or transformer network where spatial information is input to output one or more values for a region or the entire patient.

The model prior to machine training defines an architecture of connections. Various learnable parameters are part of the architecture, such as activation functions at nodes, what nodes to connect, and/or weights for connections. Machine training based on training data is used to learn the values of the learnable parameters. Fixed or given parameters may also be included in the architecture. The training of the model configures the model for inference as a machine-learned model. Different types of training, models, and/or training data may result in different inference.

For training, a processor (e.g., computer, server, workstation, tensor processor, or graphics processing unit) machine trains the model to infer an output in response to an input. For an image-to-image network or model, the input includes values representing different locations, and the output includes values representing different locations. An optimization is performed using training data (i.e., sample inputs and corresponding ground truth outputs) to learn the values of the learnable parameters that best result in the ground truth outputs given the inputs across the set of training data. Any of various optimizations or learning approaches may be used, such as deep or meta learning. Adam optimization may be used. The optimization relies on a loss representing a difference of the output from the model in response to input of the sample to the ground truth. Any of various loss functions may be used, such as signed distance, L1 norm, L2 (MSE) norm, or others.

The training data may use a curated dataset, such as a collection of inputs and corresponding outputs. The training data may be created or collected, such as arranging for scans of patients to create training data and/or collecting from previously scanned patients. The training data may be from simulations and/or from patient medical records.

The model as machine trained is stored. Upon completion of the training, the model, including the learned values of the learnable parameters, is established. This model with the learned values is stored in a memory. Copies may be distributed for use at different locations, by different medical institutions, and/or for different patients. The stored copies may then be used to infer.

In act 112, the processor generates a segmentation of tissues internal to the patient from the acquired patient data. For example, the segmentation by tissue type is generated in response to the surface data captured in act 102 with or without the MR localizer image and/or clinical data. The patient measurements for the outer surface are used to identify locations of different types of tissue within the patient.

The segmentation may use a template fitting, such as fitting a statistical shape model or a physics model that includes the outer surface and corresponding internal organs or tissues. By fitting the outer surface, the internal tissues are deformed. The fitting of the outer surface determines the locations of different tissues.

In another approach, a machine-learned model generates the segmentation in response to input of the surface data. Artificial intelligence modeling is used. A patient-specific model may better represent anatomical variabilities (e.g. extreme lean or fat body compositions for a given height and/or weight). The body surface is extracted from or represented in RGBD data, and relevant metrics are computed from the surface data (e.g., height, isocenter location). Properties dependent on internal anatomy can also be computed (e.g. weight, body composition, internal landmarks, X-ray attenuation). The locations of different types of tissues may be estimated.

In one approach, training data is acquired from patients or a database. For example, MR systems with depth cameras scan patients. The medical records of those patients are collected. The full MR, computed tomography (CT), and/or other scans provide information that may be used to indicate tissue type by voxel or location in the patient. The camera images provide the outer surface data. The defined architecture (e.g., image-to-image model) is machine trained from the patient data for tens, hundreds, or thousands of patients. The training data may include other information, such as localizer images and/or clinical data for sample inputs.

The machine-learned model outputs the segmentation 210 in response to input of the patient data. The segmentation represents tissue type by location. The tissue type may be used to look-up the values of any parameters of interest, such as tissue density, tissue permittivity, tissue permeability, and/or tissue thermal conductivity by the tissue type.

Alternatively, the segmentation 210 output by the machine-learned model is a tissue map of one or more parameters of interest. Other tissue maps may be generated instead of or in addition to tissue type. For example, the machine-learned model was trained to output maps in two or three dimensions for tissue density, tissue permittivity, tissue permeability, and/or tissue thermal conductivity in response to the inputs (e.g., outer surface data).

For SAR modeling, the model is trained to generate relevant tissue maps (tissue density, permittivity, permeability, thermal conductivity for explicit tissue heating modeling) from external whole-body camera views and/or MR localizers. Any tissue map to be used for SAR simulation (e.g., FDTD) may be generated as the segmentation. Since most tissue properties cannot be directly measured in vivo, the tissue properties are decomposed into a tissue segmentation model and a model of distribution of tissue parameters for each tissue. For example, the segmentation provides a distribution of tissue types for a given patient volume. The physical parameters (tissue characteristics relevant for electric field simulation) are looked-up by the type of tissue, providing tissue maps of physical parameters for the patient.

Where a machine-learned model is used for segmentation, different modalities may be used to provide for more accurate segmentation. Cross-modality expertise may be leveraged for creating the ground truth used in training. For example, both MR and CT may be used to define the ground truth tissue type. CT may provide tissue type for tissue not well distinguished in MR. Tissue density may be better distinguished with CT. By including training data from different modalities, the number of samples may be increased. Posterior uncertainty can be modeled in case of information-limited inputs and converted into safety margins.

Where the machine-learned model is trained to receive different types of inputs, additional uncertainty in segmentation may be reduced. For example, MR data, such as a scout scan or MR localizer image, is input with the surface data to the machine-learned model. The machine-learned model may infer the segmentation from all the inputs. The uncertainty in segmentation may be reduced by the addition of the tomographic MR localizer and/or by clinical data.

In act 114, the processor estimates a SAR characteristic based on the segmentation. Any SAR characteristic may be estimated. The SAR characteristic is information based on the patient used for SAR calculation. Example SAR characteristics include the radio frequency absorption or dissipation of power or energy in the patient tissue, the electric field (e.g., magnitude of the stationary electric field over a time window (e.g., 10 seconds or 6 minutes)), B1 applied for the patient (i.e., as a function of tissue), or the SAR metric itself (e.g., head SAR, exposed SAR, full body SAR, or local SAR).

The estimate is a field or map. The SAR characteristic at different locations in an area or volume is estimated. For example, the radio frequency absorbed power or stationary electric field is estimated for each voxel in a three-dimensional region of the patient. In alternative implementations, a single SAR characteristic value is estimated, such as the head SAR, exposed SAR, full body SAR, or one local SAR. One value for each of multiple SAR metrics may be estimated. The estimate of act 114 provides the determination of act 110 such that the determination of the SAR metric is performed by or output by the machine-learned model or another simulation 230.

In one implementation, FDTD or another EM simulation 230 for SAR estimation is performed. Full simulation of radio frequency field propagation is performed using the FDTD method until the stationary field distribution is found. From that full dynamic field, only the magnitude of the stationary electric field is needed for SAR modeling. A physics or biophysical model provides SAR modelling to determine the SAR characteristic (e.g., stationary electric field) using FDTD.

In another implementation, the processor applies a machine-learned model to estimate. AI-accelerated EM simulation 230 is provided. In response to input, the machine-learned model outputs the SAR characteristic. For example, a direct mapping from tissue properties to absorbed RF power is machine learned by supervised learning. In one approach, an image-to-image network or model is trained with training data created as three-dimensional tissue maps (e.g., type of tissue or tissue properties-density, permittivity, permeability, thermal conductivity) for input and SAR characteristic as output. The samples are created by simulation or scans of patients to determine the input, and FDTD simulation to determine the ground truth output. Real, patient-specific measurements may be used as the ground truth. In machine learning, the loss or distance between absorbed power maps or other SAR characteristic computed by FDTD simulation and the output of the network given input tissue properties is calculated.

The EM simulation 230 uses the tissue type and/or tissue properties as inputs. The segmentation is input, such as a three-dimensional map of tissue type or three-dimensional maps of the tissue density, tissue permittivity, tissue permeability, and tissue thermal conductivity tissue output as the segmentation 210.

In a further approach, the EM simulation 230 receives as input additional information with the segmentation for data consistency. For example, clinical data for the patient may be input. In other examples, information about the MR scanner is input, such as the main magnet field B0, scan protocol to be used, B1 field (map of power or energy to be transmitted by location), radio frequency transmit profiles, and/or other information. FIG. 2 shows an example. The MR measurements 220, such as the power to be transmitted and B adjustment scans (inhomogeneous B1 field as a change from the power) (i.e., radio frequency transmit profiles), are input with the segmentation 210 to the EM simulation 230. The radio frequency transmit profiles may be input where uniform but are particularly helpful as inputs where not spatially uniform. The field simulation 230 accounts for inhomogeneous B1 transmits, which may be useful for 7T systems where inhomogeneous B1 is more likely used or may enable SAR monitoring of MR systems with relaxed homogeneity requirements. The SAR characteristic is estimated by the machine-learned model or other EM simulation 230 in response to input of the segmentation and radio frequency transmit profiles of the MR scanner.

The processor determines a value or values for the SAR metric from the SAR characteristic in act 110. The EM simulation 230 generates dissipated power maps or other SAR characteristic maps. Different SAR metrics may be computed from the SAR characteristic map or maps. For example, a head SAR, exposed SAR, full body SAR, or local SAR are calculated from the SAR characteristics. Other regional SAR (e.g., WB) may be calculated. Local SAR maps showing different local SAR values by location may be calculated. Tissue heating may be estimated. B1 inhomogeneities may be estimated. The EM simulation 230 captures the expected field dependency in patient size, so a patient-specific SAR metric is provided.

SAR computation as a program may provide regulatory flexibility. A common AI system (e.g., machine-learned model as the EM simulation 230) may be used generically across multiple regulatory environments with different requirements. The output is used to calculate the desired figure of merit (SAR metric) to comply with applicable guidelines of a given situation or MR scan. Supervision of local SAR may be provided given the fast and patient specific estimate of local SAR values.

Using machine-learned models for the segmentation 210 and the EM simulation 230 may result in determination of the SAR metric quickly, such as less than two seconds. An FDTD based simulation 230 may take many minutes, such as about one hour. This rapid determination of the value for the SAR metric avoids delays and may be used patient-by-patient to determine whether a particular MR scan is acceptable for the patient prior to scanning. The EM simulation 230 implemented with a machine-learned model may be robust to patient variability.

Using machine-learned models for the segmentation 210 and EM simulation 230 is provided in one implementation. The segmentation 210 is output as tissue type with a look-up of known tissue properties by tissue type, and the SAR characteristic is output as power absorption or dissipation. The SAR metric is calculated from the SAR characteristic map, so accurate SAR estimation is provided. FIG. 3 shows the spatial error metrics for this arrangement. Increased accuracy of SAR estimation by patient may reduce the safety margins required to keep burn probabilities below a given threshold, thus increasing the sequence design space (e.g. larger flip angles, higher SMS factors, . . . ).

In act 120 of FIG. 1, the MR scanner performs MR scanning of the patient. The SAR metric is estimated before the full diagnostic MR scan of the patient. Where the value of the SAR metric is or values of the SAR metrics are within the safety threshold or thresholds, the MR scanning is acceptable for that patient. The SAR metric thresholds set safety limits to avoid burn or other risk for the patient.

The MR diagnostic scan is performed. The RF transmit profiles are transmitted into the patient from the coils as part of the MR scan. The scan is guided by a protocol, which establishes values for settings or control of the scanning. A pulse sequence (i.e., plurality of pulses from one or more coils) is created based on the configuration of the MR scanner (e.g., the imaging protocol selected and any adjusted settings). The pulse sequence is transmitted from coils into the patient. The resulting responses are measured by receiving RF signals at the same or different coils. The scanning results in raw measurements (k-space data) as the scan data. The scan data is reconstructed into images for diagnosis.

Where a value of a SAR metric is outside the safety threshold, the MR scan is not performed. Instead, the MR scan may be altered to reduce burn risk. Once the burn risk is reduced to position the value of the SAR metric within the safety threshold, such as by moving the patient and/or changing MR scan settings for the diagnostic MR scan, the patient is scanned.

The SAR metric may be estimated during a scan or after a scan. This estimation may be used to diagnosis burn and/or to avoid burn by ceasing an on-going MR scan. Measurements of power absorption may be made during the scan and used as separate inputs for SAR determination or use for separate SAR determination.

In act 130, the SAR characteristic estimated in act 114 or information derived therefrom may be used to improve MR acquisition and/or reconstruction. For example, the estimated electric field (B1 map as corrected for tissue in the patient) is used to correct for spatially varying flip angles. The SAR characteristic over various locations is used to account for spatially varying flip angles, allowing adjustment of transmitted pulses and/or accounting for the variation in reconstruction. As another example, B1 maps do not need to be measured in adjustment steps, but instead the estimated B1 map accounting for tissue of the patient is used, speeding up the overall imaging. If the B1 map is known, certain RF pulses can be better calculated. This is especially relevant for multi-channel transmit systems (pTX). For some special applications like MR-Fingerprinting, the B1 information can be used to correct the postprocessing. Other SAR characteristics may be used for controlling scanning and/or reconstruction.

In act 140, an image is displayed. The processor generates an image. The image may be of the patient. For example, a segmentation image is displayed. As another example, an MR image reconstructed from a diagnostics scan is displayed. In yet another example, an MR localizer image is displayed. The image may be of other information, such as displaying the value of the SAR metric or that it is safe or not safe to scan the patient. Combinations of images may be displayed, such as the segmentation and MR image of the patient.

FIG. 4 shows one embodiment of a system for estimating SAR in MR scanning. The system is an MR scanner 400 or may be a server, workstation, or computer for operating on data from the camera 480 and or MR scanner 400. The system determines a value for a SAR metric from surface data from the camera 480 using at least one machine-learned model 474. The system performs the acts of FIG. 1, workflow of FIG. 2, or another method or workflow.

The MR scanner 400 includes a main field magnet 410, gradient coils 420, whole body coil 430, local coils 440, and/or a patient support (e.g., table) 460. The system includes the MR scanner 400, processor 470, memory 472, and display 476. One or more sensors 480 separate from the coils 420, 430, 440 may be provided. Additional, different, or fewer components may be provided for the MR scanner 400 and/or system. For example, the local coils 440 or the whole-body coil 430 are not used. In another example, the processor 470, memory 472, and display 476 are provided without the coils 410-440 and patient support 460, such as a workstation operating on scan data stored in the memory 472. In yet another example, the processor 470, memory 472, and/or display 476 are part of the MR scanner 400. In another example, the camera 480 is not provided, such as where a localizer image from the the MR scanner 400 is used for inference.

The MR scanner 400 is configured by settings of controls to diagnostically scan a region of the patient 450. The scan provides scan data in a scan domain. The MR scanner 400 scans the patient 450 to provide raw measurements. The MR scanner 400 is configured to transmit radio frequency (RF) pulses into a patient.

For the scan, the main field magnet 410 creates a static base magnetic field, B0, in the body or part of the body of the patient 450 positioned on the patient support 460. The gradient coils 420 produce position dependent magnetic field gradients superimposed on the static magnetic field. The gradient coils 420 produce position dependent and shimmed magnetic field gradients in three orthogonal directions and generate magnetic field pulse sequences. The whole-body coil 430 and/or the local coils 440 receive radio frequency (RF) transmit pulses, producing magnetic field pulses (B1) that rotate the spins of the protons in the imaged region of the patient 450.

In response to applied RF pulse signals, the whole-body coil 430 and/or local coils 440 receive MR signals, i.e., signals from the excited protons within the body as the protons return to an equilibrium position established by the static and gradient magnetic fields. The MR signals are detected and processed by a detector, providing an MR dataset of raw data. A raw storage array of the memory 472 stores corresponding individual measurements forming the MR dataset.

This diagnostic scan relies, in part, on the location of the target. The spatial positioning of the scan is located to scan the target. This target location is within a homogenous volume field of view of the MR scanner 400 by the scan plan. By locating the target, the most homogenous field of view of the MR scanner 400 may be positioned at the target for the diagnostic scan. A scout scan is used to localize the target for then performing a diagnostic scan.

The patient support 460 is a flat or contoured slab (e.g., table) on which the patient 450 lies or is supported. In an open bore, the patient support 460 may be formed as a recliner or chair given a larger bore. The patient support 460 is movable relative to the MR scanner 400 (i.e., the main field magnet 410, gradient coils 420, and whole-body coil 430). The patient support 460 moves the patient 450 so that the region of interest is within the field of view of the MR scanner 400 to allow localization.

The MR scanner 400 then performs one or more scout scans. The scout scan is used to localize an organ or patient region of interest relative to the MR scanner for then performing the diagnostic or full MR scan. The scout scan may have a lesser field of view, such as not being whole body and/or not including parts or all of the arms, legs, and/or head. The field of view, time, and/or resolution used for a scout scan is less than used for the diagnostic scan. The scout scan purpose is to locate the organ or object of interest in the patient, as compared to the diagnostic scan purpose of high-resolution examination for medical diagnosis. MR localizer images acquired from very short scans are generally used in MR examination as scout images to localize the anatomical position of the internal organ to be examined. The scout scan, after reconstruction, provides one or more MR localizer images used for localization.

The camera 480 is one or more cameras or sensors. The camera 480 is positioned outside of the bore or MR scanner 400 field of view but may be within the bore. The camera 480 mounts to the housing of the MR scanner 400, a robotic arm, wall, ceiling, or sensor tree. The camera 480 is positioned so that the camera 480 field of view captures all or part of the patient 450 while the patient 450 is within the bore and/or on the table 150. For example, the camera 480 field of view reaches an exterior part of the patient 450 while the patient 450 is positioned on the patient support 460 where the patient is positioned for or in preparation for MR scanning.

The camera 480 is an active or passive sensor. For example, the camera 480 is a red-green-blue-depth (RGBD) camera, stereo camera with or without a light projector, or another camera for capturing optical images with range or depth information. Infrared cameras or cameras for other visual or non-visual frequencies may be used. Other types of cameras may be provided, such as laser rangefinders or radio frequency sensors. In an alternative, or additional, example, the camera 480 is an active sensor, such as an ultrasound scanner that transmits acoustic energy in a steerable way and receives echoes or a camera on a robotic arm that actively moves the camera. The camera 480 is positioned or otherwise configured to capture an outer surface of the patient 450.

The processor 470 is a general processor, digital signal processor, graphics processing unit, application specific integrated circuit, field programmable gate array, artificial intelligence processor, tensor processor, digital circuit, analog circuit, combinations thereof, or another now known or later developed device for segmenting, estimating SAR characteristics, and/or determining a value for a SAR metric. Since the processor 470 operates on spatial information, the processor 470 is an image processor. The processor 470 is a single device, a plurality of devices, or a network. For more than one device, parallel or sequential division of processing may be used. Different devices making up the processor 470 may perform different functions, such as configuring the MR scanner 400 to scan by one device, segmenting by another device, and estimating SAR characteristic by yet another device. In one embodiment, the processor 470 is a control processor or other processor of the MR scanner 400. Other processors of the MR scanner 400 or external to the MR scanner 400 may be used. For example, the processor 470 is part of a workstation, server, or computer.

The processor 470 is configured by software, firmware, and/or hardware to perform its tasks. The processor 470 operates pursuant to instructions stored on a non-transitory medium (e.g., memory 472) to perform various acts described herein.

The processor 470 is configured to determine a value for a SAR metric for the RF pulses to be transmitted into the patient 450. The processor 470 is configured to determine the value based on inputs, such as the outer surface of the patient determined from data of the camera 480 and/or a localizer image from the MR scanner 400. Other inputs may be included, such as clinical data stored in the memory 472 or received from a user interface.

The processor 470 implements one or more machine-learned models 474 to determine the value for the SAR metric from the input. For example, a machine-learned model 474 was trained to receive the input and output the value for the SAR metric or SAR characteristic. In other examples, a machine-learned model 474 was trained to receive the inputs and output a segmentation and/or to receive tissue type or properties and output SAR characteristic or SAR metric. The processor 470 may be configured to look-up or assign tissue properties based on tissue type, creating tissue property maps, calculate a value for a SAR metric from a map of SAR characteristic, segment, and/or determine SAR characteristics from segmentation or tissue property maps without applying a machine-learned model for those calculations.

In one approach, the processor 470 is configured to segment types of tissue or tissue properties internal of the patient as output of by one machine-learned model 474 in response to input of data representing the outer surface from the camera 480 with or without other input (e.g., localizer image and/or clinical data), and the processor 470 is configured to estimate RF power or electric field as output of another machine-learned model 474 in response to input of the segmented types of tissue or tissue maps derived from the segmented types of tissue. The processor 470 is configured to calculate the value of the SAR metric from the RF power or electric field.

The machine-learned model 474 is one or more models. Hierarchal, sequential, multi-task, or other machine-learned model arrangements may be used. The machine-learned model 474 is formed from one or more networks and/or another machine-learned architecture (e.g., support vector machine). For example, the machine-learned network is a deep neural network. In another example, the machine-learned network is a neural network. An image-to-image model, such as a convolutional neural network with layers arranged as an encoder and decoder or U-Net, is used for the machine-learned model or models 474 in one implementation. Other models may be used.

The machine learned model 474 is trained by training data (input samples with ground truth). A loss based on output of the model being trained compared to an objective function or ground truth is used in an optimization to train the model. Any optimization may be used, such as Adam or stochastic gradient descent (SGD). Any loss may be used, such as cross entropy, L1 loss, or L2 loss. Pre-training, cross-training, and/or continuous training may be used. The training data is gathered from a database of examples (e.g., curated by an expert from medical records of patients) and/or created using a process or algorithm. Ground truth may be curated or created by expert review. Instead, or in addition, the training data may be created by modeling or synthetically created.

The processor 470 is configured to cause the MR scanner 400 to perform the scan of the diagnostic region based on the value of the SAR metric or values of SAR metrics. The values are compared to safety thresholds. When the value or values are within the safety threshold or thresholds, the processor 470 allows the MR diagnostic scan to proceed, starts the scan, and/or outputs the SAR check or pass information to the user. When any one SAR value being checked is not within the safety threshold, a warning is generated and/or the diagnostic scan is not allowed to proceed.

The processor 470 reconstructs an MR image from the raw data acquired from the MR diagnostic scan. The MR image is diagnostically useful to the physician, and safely acquired with low risk to the patient.

The memory 472 is a cache, buffer, RAM, removable media, hard drive, or another computer readable storage medium. Non-volatile computer readable storage media include various types of volatile and nonvolatile storage media.

The memory 472 stores raw data (e.g., scan data), the settings for the controls, the machine-learned model 474, input data (e.g., outer surface data from the camera, localizer image, and/or clinical data), output data (e.g., segmentation by tissue type, tissue property maps, electric field maps, power or energy dissipation or absorption maps, SAR characteristic maps, or values for SAR metrics), look-up tables of tissue properties by tissue type, SAR thresholds, and/or other data. The memory 472 may alternatively or additionally store instructions for the processor 470. The functions, acts or tasks illustrated in the figures or described herein are executed by the processor 470 in response to one or more sets of instructions stored in or on the non-transitory computer readable storage media of the memory 472. The functions, acts or tasks are independent of the particular type of instructions set, storage media, processor or processing strategy and may be performed by software, hardware, integrated circuits, firmware, micro code, and the like, operating alone or in combination.

In one embodiment, the instructions are stored on a removable media device for reading by local or remote systems. In other embodiments, the instructions are stored in a remote location for transfer through a computer network. In yet other embodiments, the instructions are stored within a given computer, CPU, GPU, or system. Because some of the constituent system components and method steps depicted in the accompanying figures may be implemented in software, the actual connections between the system components (or the process steps) may differ depending upon the way the present embodiments are programmed.

The display 476 is a display screen (e.g., CRT, LCD, plasma, or projector), or printer. In additional or alternative approaches, a speaker, haptic feedback, or another device to communicate to a user is provided. The display 476 is configured, for example, by loading an image to a display plane or buffer by the processor 470. The display 476 is configured to display the value or values for the SAR metric or metrics. A warning, alert, or information is output to indicate safety or not for a MR diagnostic scan of the patient 450. Where safety is sufficient, the output may be to alter the diagnostic MR scan to have greater SAR. The output may be used to automatically configure the diagnostic scan to avoid burns without manual control of the settings.

Other information than a warning or safety information may be output. For example, the image from the camera 480, MR localizer, segmentation, tissue property map, SAR characteristic, MR diagnostic, or other images of the patient are displayed.

Figure 5:
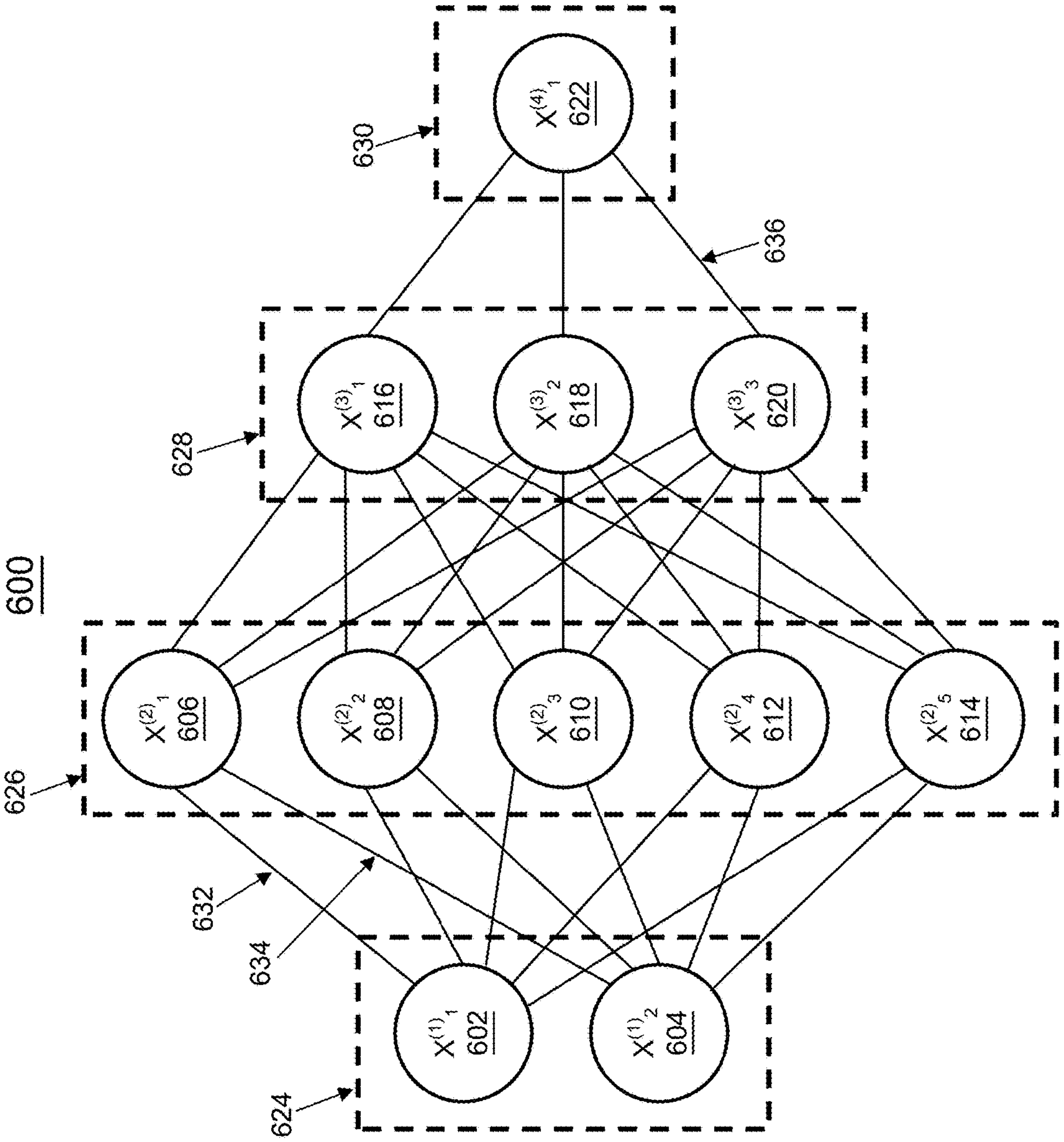
FIG. 5 illustrates an example neural network for estimating or segmenting.

FIG. 5 shows an embodiment of an artificial neural network 600, in accordance with one or more embodiments (e.g., machine-learned model(s) 474). Alternative terms for "artificial neural network" are "neural network," "artificial neural net" or "neural net." Machine learning networks described herein, such as, e.g., the one or more machine learning based models utilized at act 110, act 112, and/or act 114 of FIG. 1, the segmentation 210 of FIG. 2, the EM simulator 230 of FIG. 2, or the model 474 of FIG. 4, or any other machine learning network described herein may be implemented using artificial neural network 600.

The artificial neural network 600 comprises nodes 602-622 and edges 632, 634, . . . , 636, wherein each edge 632, 634, . . . , 636 is a directed connection from a first node 602-622 to a second node 602-622. In general, the first node 602-622 and the second node 602-622 are different nodes 602-622, it is also possible that the first node 602-622 and the second node 602-622 are identical. For example, in FIG. 5, the edge 632 is a directed connection from the node 602 to the node 606, and the edge 634 is a directed connection from the node 604 to the node 606. An edge 632, 634, . . . 636 from a first node 602-622 to a second node 602-622 is also denoted as "ingoing edge" for the second node 602-622 and as "outgoing edge" for the first node 602-622.

In this implementation, the nodes 602-622 of the artificial neural network 600 can be arranged in layers 624-630, wherein the layers can include an intrinsic order introduced by the edges 632, 634, . . . , 636 between the nodes 602-622.

In particular, the edges 632, 634, . . . , 636 can exist only between neighboring layers of nodes. In the implementation shown in FIG. 5, there is an input layer 624 comprising only nodes 602 and 604 without an incoming edge, an output layer 630 comprising only node 622 without outgoing edges, and hidden layers 626, 628 in-between the input layer 624 and the output layer 630. In general, the number of hidden layers 626, 628 can be chosen arbitrarily. The number of nodes 602 and 604 within the input layer 624 usually relates to the number of input values of the neural network 600, and the number of nodes 622 within the output layer 630 usually relates to the number of output values of the neural network 600.

In particular, a (real) number can be assigned as a value to every node 602-622 of the neural network 600. Here, $x^{(n)}$; denotes the value of the i-th node 602-622 of the n-th layer 624-630. The values of the nodes 602-622 of the input layer 624 are equivalent to the input values of the neural network 600, the value of the node 622 of the output layer 630 is equivalent to the output value of the neural network 600. Furthermore, each edge 632, 634, . . . , 636 can include a weight being a real number, in particular, the weight is a real number within the interval [−1, 1] or within the interval [0, 1]. Here, $w^{(m,n)}_{i,j}$ denotes the weight of the edge between the i-th node 602-622 of the m-th layer 624-630 and the j-th node 602-622 of the n-th layer 624-630. Furthermore, the abbreviation $w^{(n)}_{i,j}$ is defined for the weight $w^{(n,n+1)}_{i,j}$.

In particular, to calculate the output values of the neural network 600, the input values are propagated through the neural network. In particular, the values of the nodes 602-622 of the (n+1)-th layer 624-630 can be calculated based on the values of the nodes 602-622 of the n-th layer 624-630 by $$x_j^{(n+1)} = f\left(\sum_i x_i^{(n)} \cdot w_{i,j}^{(n)}\right).$$

Herein, the function f is a transfer function (another term is "activation function"). Known transfer functions are step functions, sigmoid function (e.g., the logistic function, the generalized logistic function, the hyperbolic tangent, the Arctangent function, the error function, the smoothstep function) or rectifier functions. The transfer function is mainly used for normalization purposes.

In particular, the values are propagated layer-wise through the neural network, wherein values of the input layer 624 are given by the input of the neural network 600, wherein values of the first hidden layer 626 can be calculated based on the values of the input layer 624 of the neural network, wherein values of the second hidden layer 628 can be calculated based in the values of the first hidden layer 626, etc.

To set the values $w^{(m,n)}_{i,j}$ for the edges, the neural network 600 has to be trained using training data. In particular, training data comprises training input data and training output data (denoted as $t_i$). For training, the neural network 600 is applied to the training input data to generate calculated output data. In particular, the training data and the calculated output data comprise a number of values, said number being equal with the number of nodes of the output layer.

In particular, a comparison between the calculated output data and the training data is used to recursively adapt the weights within the neural network 600 (backpropagation algorithm). In particular, the weights are changed according to:

$$w'^{(n)}_{i,j} = w^{(n)}_{i,j} - \gamma \cdot \delta^{(n)}_j \cdot x^{(n)}_i$$

wherein γ is a learning rate, and the numbers $\delta^{(n)}_j$ can be recursively calculated as:

$$\delta_j^{(n)} = \left(\sum_k \delta_k^{(n+1)} \cdot w_{j,k}^{(n+1)}\right) \cdot f'\left(\sum_i x_i^{(n)} \cdot w_{i,j}^{(n)}\right)$$

based on $\delta^{(n+1)}_j$, if the (n+1)-th layer is not the output layer, and $$\delta_j^{(n)} = \left(x_k^{(n+1)} - t_j^{(n+1)}\right) \cdot f'\left(\sum_i x_i^{(n)} \cdot w_{i,j}^{(n)}\right)$$

if the (n+1)-th layer is the output layer 630, wherein f' is the first derivative of the activation function, and $y^{(n+1)}_j$ is the comparison training value for the j-th node of the output layer 630.

Figure 6:
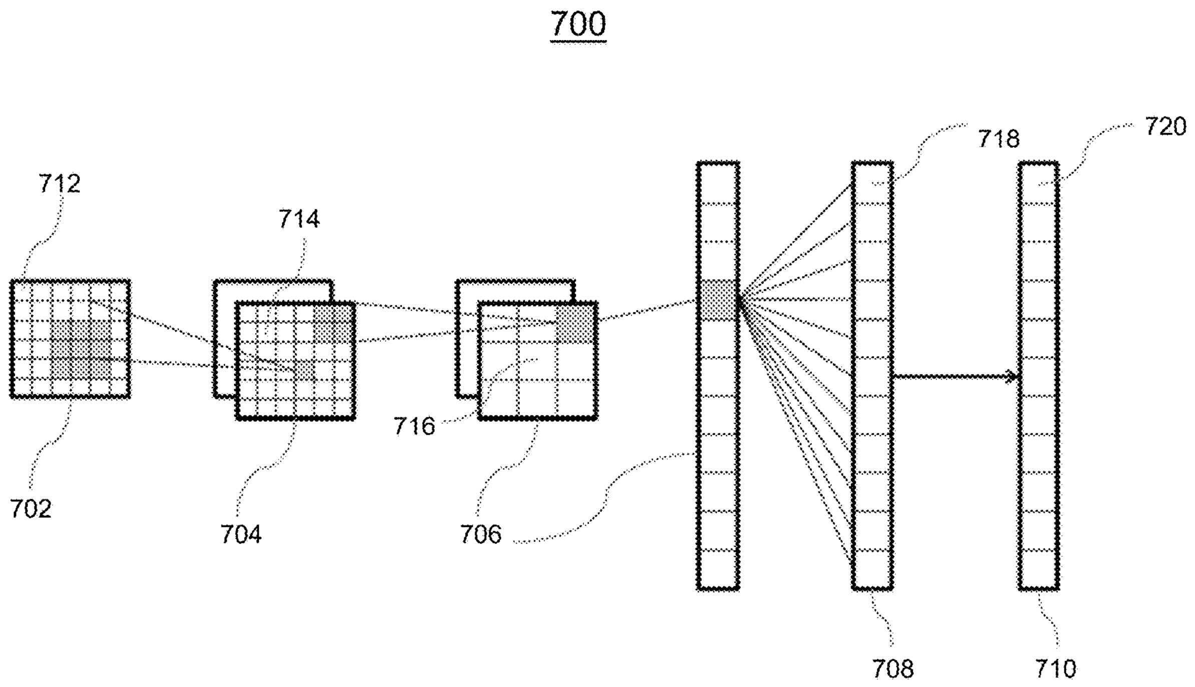
FIG. 6 illustrates an example convolutional network for estimating or segmenting.

FIG. 6 shows a convolutional neural network 700, in accordance with one or more embodiments. Machine learning networks described herein, such as, e.g., the one or more machine learning based models utilized at act 110, act 112, and/or act 114 of FIG. 1, the segmentation 210 of FIG. 2, the EM simulator 230 of FIG. 2, or the model 474 of FIG. 4, or any other machine learning network or model described herein may be implemented using the convolutional neural network 700.

In the implementation shown in FIG. 6, the convolutional neural network comprises 700 an input layer 702, a convolutional layer 704, a pooling layer 706, a fully connected layer 708, and an output layer 710. Alternatively, the convolutional neural network 700 can include several convolutional layers 704, several pooling layers 706, and several fully connected layers 708, as well as other types of layers. The order of the layers can be chosen arbitrarily, usually fully connected layers 708 are used as the last layers before the output layer 710.

In particular, within a convolutional neural network 700, the nodes 712-720 of one layer 702-710 can be considered to be arranged as a d-dimensional matrix or as a d-dimensional image. In particular, in the two-dimensional case, the value of the node 712-720 indexed with i and j in the n-th layer 702-710 can be denoted as $x^{(n)}[i, j]$. However, the arrangement of the nodes 712-720 of one layer 702-710 does not have an effect on the calculations executed within the convolutional neural network 700 as such, since these are given solely by the structure and the weights of the edges.

In particular, a convolutional layer 704 is characterized by the structure and the weights of the incoming edges forming a convolution operation based on a certain number of kernels. In particular, the structure and the weights of the incoming edges are chosen such that the values $x^{(n)}_k$ of the nodes 714 of the convolutional layer 704 are calculated as a convolution $x^{(n)}_k = K_k * x^{(n-1)}$ based on the values $x^{(n-1)}$ of the nodes 712 of the preceding layer 702, where the convolution * is defined in the two-dimensional case as $$x_k^{(n)}[i, j] = \left(K_k * x^{(n-1)}\right)[i, j] = \sum_{i'} \sum_{j'} K_k[i', j'] \cdot x^{(n-1)}[i - i', j - j'].$$

Here the k-th kernel $K_k$ is a d-dimensional matrix (in this embodiment a two-dimensional matrix), which is usually small compared to the number of nodes 712-718 (e.g., a 3×3 matrix, or a 5×5 matrix). In particular, this implies that the weights of the incoming edges are not independent but chosen such that they produce said convolution equation. In particular, for a kernel being a 3×3 matrix, there are only 9 independent weights (each entry of the kernel matrix corresponding to one independent weight), irrespectively of the number of nodes 712-720 in the respective layer 702-710. In particular, for a convolutional layer 704, the number of nodes 714 in the convolutional layer is equivalent to the number of nodes 712 in the preceding layer 702 multiplied with the number of kernels.

If the nodes 712 of the preceding layer 702 are arranged as a d-dimensional matrix, using a plurality of kernels can be interpreted as adding a further dimension (denoted as "depth" dimension), so that the nodes 714 of the convolutional layer 704 are arranged as a (d+1)-dimensional matrix. If the nodes 712 of the preceding layer 702 are already arranged as a (d+1)-dimensional matrix comprising a depth dimension, using a plurality of kernels can be interpreted as expanding along the depth dimension, so that the nodes 714 of the convolutional layer 704 are arranged also as a (d+1)-dimensional matrix, wherein the size of the (d+1)-dimensional matrix with respect to the depth dimension is by a factor of the number of kernels larger than in the preceding layer 702.

The advantage of using convolutional layers 704 is that spatially local correlation of the input data can be exploited by enforcing a local connectivity pattern between nodes of adjacent layers, in particular by each node being connected to only a small region of the nodes of the preceding layer.

In embodiment shown in FIG. 6, the input layer 702 includes 36 nodes 712, arranged as a two-dimensional 6×6 matrix. The convolutional layer 704 includes 72 nodes 714, arranged as two two-dimensional 6×6 matrices, each of the two matrices being the result of a convolution of the values of the input layer with a kernel. Equivalently, the nodes 714 of the convolutional layer 704 can be interpreted as a three-dimensional 6×6×2 matrix, wherein the last dimension is the depth dimension.

A pooling layer 706 can be characterized by the structure and the weights of the incoming edges and the activation function of its nodes 716 forming a pooling operation based on a non-linear pooling function f. For example, in the two-dimensional case, the values $x^{(n)}$ of the nodes 716 of the pooling layer 706 can be calculated based on the values $x^{(n-1)}$ of the nodes 714 of the preceding layer 704 as $$x^{(n)}[i, j] = f\left(x^{(n-1)}[id_1, jd_2], \ldots, x^{(n-1)}[id_1 + d_1 - 1, jd_2 + d_2 - 1]\right)$$

In other words, by using a pooling layer 706, the number of nodes 714, 716 can be reduced, by replacing a number d1·d2 of neighboring nodes 714 in the preceding layer 704 with a single node 716 being calculated as a function of the values of said number of neighboring nodes in the pooling layer. In particular, the pooling function f can be the max-function, the average, or the L2-Norm. In particular, for a pooling layer 706 the weights of the incoming edges are fixed and are not modified by training.

The advantage of using a pooling layer 706 is that the number of nodes 714, 716 and the number of parameters is reduced. This leads to the amount of computation in the network being reduced and to a control of overfitting.

In the embodiment shown in FIG. 6, the pooling layer 706 is a max-pooling, replacing four neighboring nodes with only one node, the value being the maximum of the values of the four neighboring nodes. The max-pooling is applied to each d-dimensional matrix of the previous layer; in this embodiment, the max-pooling is applied to each of the two two-dimensional matrices, reducing the number of nodes from 72 to 18.

A fully-connected layer 708 can be characterized by the fact that a majority, in particular, all edges between nodes 716 of the previous layer 706 and the nodes 718 of the fully-connected layer 708 are present, and wherein the weight of each of the edges can be adjusted individually.

In this implementation, the nodes 716 of the preceding layer 706 of the fully-connected layer 708 are displayed both as two-dimensional matrices, and additionally as non-related nodes (indicated as a line of nodes, wherein the number of nodes was reduced for a better presentability). In this implementation, the number of nodes 718 in the fully connected layer 708 is equal to the number of nodes 716 in the preceding layer 706. Alternatively, the number of nodes 716, 718 can differ.

Furthermore, in this implementation, the values of the nodes 720 of the output layer 710 are determined by applying the Softmax function onto the values of the nodes 718 of the preceding layer 708. By applying the Softmax function, the sum of the values of all nodes 720 of the output layer 710 is 1, and all values of all nodes 720 of the output layer are real numbers between 0 and 1.

A convolutional neural network 700 can also comprise a ReLU (rectified linear units) layer or activation layers with non-linear transfer functions. In particular, the number of nodes and the structure of the nodes contained in a ReLU layer is equivalent to the number of nodes and the structure of the nodes contained in the preceding layer. In particular, the value of each node in the ReLU layer is calculated by applying a rectifying function to the value of the corresponding node of the preceding layer.

The input and output of different convolutional neural network blocks can be wired using summation (residual/dense neural networks), element-wise multiplication (attention) or other differentiable operators. Therefore, the convolutional neural network architecture can be nested rather than being sequential if the whole pipeline is differentiable.

In particular, convolutional neural networks 700 can be trained based on the backpropagation algorithm. For preventing overfitting, methods of regularization can be used, e.g., dropout of nodes 712-720, stochastic pooling, use of artificial data, weight decay based on the L1 or the L2 norm, or max norm constraints. Different loss functions can be combined for training the same neural network to reflect the joint training objectives. A subset of the neural network parameters can be excluded from optimization to retain the weights pretrained on another datasets.

Below are illustrative Examples. Examples of different of types (method, system, and non-transitory computer readable medium) may be used in other types. Different combinations of the examples may be provided.

In Illustrative Example 1. A method of estimating specific absorption rate (SAR) in magnetic resonance (MR) scanning, the method comprising: capturing, with a sensor, surface data representing an outer surface of a patient; generating a segmentation of tissues internal to the patient from the surface data, the segmentation generated by a first machine-learned model in response to input of the surface data; estimating a SAR characteristic by a second machine-learned model in response to input of the segmentation of the tissues; determining a value for a SAR metric from the SAR characteristic; and performing the MR scanning of the patient when the value of the SAR metric is within a safety threshold.

Illustrative Example 2. The method of Illustrative Example 1, wherein capturing comprises capturing with the sensor being a depth sensor.

Illustrative Example 3. The method of any of Illustrative Examples 1-2, wherein generating comprises generating the segmentation as tissue maps of tissue density, tissue permittivity, tissue permeability, and tissue thermal conductivity, and wherein estimating comprises estimating in response to the input of the tissue maps as the segmentation.

Illustrative Example 4. The method of any of Illustrative Examples 1-3, wherein generating comprises generating the segmentation as a map of tissue type, and further comprising assigning tissue density, tissue permittivity, tissue permeability, and tissue thermal conductivity by the tissue type, and wherein estimating comprises estimating in response to the input of the assigned tissue density, tissue permittivity, tissue permeability, and tissue thermal conductivity tissue maps as the segmentation.

Illustrative Example 5. The method of any of Illustrative Examples 1-4, further comprising acquiring MR data from a MR localizer scan, and wherein generating comprises generating in response to input of the MR data and the surface data to the first machine-learned model.

Illustrative Example 6. The method of any of Illustrative Examples 1-5, further comprising receiving clinical data for the patient, and wherein generating comprises generating in response to input of the clinical data and the surface data to the first machine-learned model.

Illustrative Example 7. The method of any of Illustrative Examples 1-6, wherein generating comprises generating by the first machine-learned model comprising a first image-to-image model, and wherein estimating comprises estimating by the second machine-learned model comprising a second image-to-image model.

Illustrative Example 8. The method of Illustrative Example 7, wherein the first and second machine-learned models comprise first and second convolutional neural networks.

Illustrative Example 9. The method of any of Illustrative Examples 1-8, wherein estimating comprises estimating absorbed radio frequency power by location in the patient as the SAR characteristic.

Illustrative Example 10. The method of any of Illustrative Examples 1-9, wherein estimating comprises estimating a magnitude of a stationary electric field by location in the patient as the SAR characteristic.

Illustrative Example 11. The method of any of Illustrative Examples 1-10, wherein estimating comprises estimating in response to input of the segmentation and radio frequency transmit profiles of the MR scanner to the second machine-learned model, wherein performing comprises performing the MR scanning using the radio frequency transmit profiles.

Illustrative Example 12. The method of Illustrative Example 11, wherein the radio frequency transmit profiles are inhomogeneous.

Illustrative Example 13. The method of any of Illustrative Examples 1-12, wherein estimating comprises estimating the SAR characteristic as the value for the SAR metric such that determining the value is performed by the second machine-learned model.

Illustrative Example 14. The method of any of Illustrative Examples 1-13, wherein determining comprises determining the value for the SAR metric, the SAR metric being a head SAR, exposed SAR, full body SAR, or local SAR.

Illustrative Example 15. The method of any of Illustrative Examples 1-14, further comprising correcting for spatially varying flip angles based on the SAR characteristic as a function of location.

Illustrative Example 16. A method of estimating specific absorption rate (SAR) in magnetic resonance (MR) scanning, the method comprising: capturing, with a sensor, surface data representing an outer surface of a patient; determining a value for a SAR metric from the surface data, the determining using a machine-learned model; and performing the MR scanning of the patient when the value of the SAR metric is within a safety threshold.

Illustrative Example 17. The method of Illustrative Example 16, wherein determining comprises segmenting tissues internal to the patient by the machine-learned model in response to input of the surface data and calculating the value using the tissues as segmented.

Illustrative Example 18. The method of any of Illustrative Examples 16-17, wherein determining comprises estimating an electric field and/or radio frequency power absorption or dissipation by the machine-learned model from tissue maps determined from the surface data.

Illustrative Example 19. A system for estimating specific absorption rate (SAR) in magnetic resonance (MR) scanning, the system comprising: a MR scanner configured to transmit radio frequency (RF) pulses into a patient; a camera configured to capture an outer surface of the patient; an image processor configured to determine a value for a SAR metric for the RF pulses from the outer surface using a machine-learned model; and a display configured to display the value for the SAR metric.

Illustrative Example 20. The system of Illustrative Example 19 wherein the machine-learned model comprises first and second machine-learned models, wherein the image processor is configured to segment types of tissue internal of the patient as output of the first machine-learned model in response to input of data representing the outer surface, wherein the image processor is configured to estimate RF power or electric field as output of the second machine-learned model in response to input of the segmented types of tissue by location or tissue maps derived from the segmented types of tissue, and wherein the image processor is configured to calculate the value of the SAR metric from the RF power or electric field.

Although the subject matter has been described in terms of exemplary embodiments, it is not limited thereto. Rather, the appended claims should be construed broadly, to include other variants and embodiments, which can be made by those skilled in the art.

What is claimed is:

1. A method of estimating specific absorption rate (SAR) in magnetic resonance (MR) scanning, the method comprising:

capturing, with a sensor, surface data representing an outer surface of a patient;

generating a segmentation of tissues internal to the patient from the surface data, the segmentation generated by a first machine-learned model in response to input of the surface data;

estimating a SAR characteristic by a second machine-learned model in response to input of the segmentation of the tissues;

determining a value for a SAR metric from the SAR characteristic; and performing the MR scanning of the patient when the value of the SAR metric is within a safety threshold.

2. The method of claim 1, wherein capturing comprises capturing with the sensor being a depth sensor.

3. The method of claim 1, wherein generating comprises generating the segmentation as tissue maps of tissue density, tissue permittivity, tissue permeability, and tissue thermal conductivity, and wherein estimating comprises estimating in response to the input of the tissue maps as the segmentation.

4. The method of claim 1, wherein generating comprises generating the segmentation as a map of tissue type, and further comprising assigning tissue density, tissue permittivity, tissue permeability, and tissue thermal conductivity by the tissue type, and wherein estimating comprises estimating in response to the input of the assigned tissue density, tissue permittivity, tissue permeability, and tissue thermal conductivity tissue maps as the segmentation.

5. The method of claim 1, further comprising acquiring MR data from a MR localizer scan, and wherein generating comprises generating in response to input of the MR data and the surface data to the first machine-learned model.

6. The method of claim 1, further comprising receiving clinical data for the patient, and wherein generating comprises generating in response to input of the clinical data and the surface data to the first machine-learned model.

7. The method of claim 1, wherein generating comprises generating by the first machine-learned model comprising a first image-to-image model, and wherein estimating comprises estimating by the second machine-learned model comprising a second image-to-image model.

8. The method of claim 7, wherein the first and second machine-learned models comprise first and second convolutional neural networks.

9. The method of claim 1, wherein estimating comprises estimating absorbed radio frequency power by location in the patient as the SAR characteristic.

10. The method of claim 1, wherein estimating comprises estimating a magnitude of a stationary electric field by location in the patient as the SAR characteristic.

11. The method of claim 1, wherein estimating comprises estimating in response to input of the segmentation and radio frequency transmit profiles of the MR scanner to the second machine-learned model, wherein performing comprises performing the MR scanning using the radio frequency transmit profiles.

12. The method of claim 11, wherein the radio frequency transmit profiles are inhomogeneous.

13. The method of claim 1, wherein estimating comprises estimating the SAR characteristic as the value for the SAR metric such that determining the value is performed by the second machine-learned model.

14. The method of claim 1, wherein determining comprises determining the value for the SAR metric, the SAR metric being a head SAR, exposed SAR, full body SAR, or local SAR.

15. The method of claim 1, further comprising correcting for spatially varying flip angles based on the SAR characteristic as a function of location.

16. A method of estimating specific absorption rate (SAR) in magnetic resonance (MR) scanning, the method comprising:

capturing, with a sensor, surface data representing an outer surface of a patient;

determining a value for a SAR metric from the surface data, the determining using a machine-learned model; and performing the MR scanning of the patient when the value of the SAR metric is within a safety threshold.

17. The method of claim 16, wherein determining comprises segmenting tissues internal to the patient by the machine-learned model in response to input of the surface data and calculating the value using the tissues as segmented.

18. The method of claim 16, wherein determining comprises estimating an electric field and/or radio frequency power absorption or dissipation by the machine-learned model from tissue maps determined from the surface data.

19. A system for estimating specific absorption rate (SAR) in magnetic resonance (MR) scanning, the system comprising:

a MR scanner configured to transmit radio frequency (RF) pulses into a patient;

a camera configured to capture an outer surface of the patient;

an image processor configured to determine a value for a SAR metric for the RF pulses from the outer surface using a machine-learned model; and a display configured to display the value for the SAR metric.

20. The system of claim 19 wherein the machine-learned model comprises first and second machine-learned models, wherein the image processor is configured to segment types of tissue internal of the patient as output of the first machine-learned model in response to input of data representing the outer surface, wherein the image processor is configured to estimate RF power or electric field as output of the second machine-learned model in response to input of the segmented types of tissue by location or tissue maps derived from the segmented types of tissue, and wherein the image processor is configured to calculate the value of the SAR metric from the RF power or electric field.

* * * * *